United States Patent
Kang et al.

(10) Patent No.: US 10,378,122 B2
(45) Date of Patent: Aug. 13, 2019

(54) METHOD FOR GROWING SINGLE CRYSTAL

(71) Applicant: SK SILTRON CO., LTD., Gumi-si, Gyeongsangbuk-do (KR)

(72) Inventors: In-Gu Kang, Gumi-si (KR); Jung-Ha Hwang, Gumi-si (KR); In-Sik Bang, Gumi-si (KR)

(73) Assignee: SK Siltron Co., Ltd. (KR)

( * ) Notice: Subject to any disclaimer, the term of this patent is extended or adjusted under 35 U.S.C. 154(b) by 0 days.

(21) Appl. No.: 15/751,041

(22) PCT Filed: Jun. 24, 2016

(86) PCT No.: PCT/KR2016/006782
§ 371 (c)(1),
(2) Date: Feb. 7, 2018

(87) PCT Pub. No.: WO2017/026648
PCT Pub. Date: Feb. 16, 2017

(65) Prior Publication Data
US 2018/0237937 A1    Aug. 23, 2018

(30) Foreign Application Priority Data

Aug. 12, 2015   (KR) .................. 10-2015-0114062

(51) Int. Cl.
*C30B 15/02*   (2006.01)
*C30B 15/20*   (2006.01)
(Continued)

(52) U.S. Cl.
CPC .............. *C30B 15/02* (2013.01); *C30B 15/04* (2013.01); *C30B 15/20* (2013.01); *C30B 29/06* (2013.01)

(58) Field of Classification Search
CPC .......... C30B 15/02; C30B 15/04; C30B 15/20
See application file for complete search history.

(56) References Cited

U.S. PATENT DOCUMENTS

| | | | |
|---|---|---|---|
| 8,872,307 B2 | 10/2014 | Nakai | |
| 2009/0173272 A1* | 7/2009 | Inagaki | ................... C30B 15/14 117/35 |
| 2014/0361408 A1* | 12/2014 | Falster | ............. H01L 21/02694 257/607 |

FOREIGN PATENT DOCUMENTS

| | | | |
|---|---|---|---|
| JP | 62226890 A | 10/1987 | |
| JP | 05117092 A | 5/1993 | |

(Continued)

OTHER PUBLICATIONS

International Search Report for corresponding International Application No. PCT/KR2016/006782 dated Oct. 21, 2016, including Eng. translation 5pp.

(Continued)

*Primary Examiner* — Robert M Kunemund
(74) *Attorney, Agent, or Firm* — Lewis Roca Rothgerber Christie LLP

(57) ABSTRACT

According to an embodiment of the present invention, there is provided a method for growing a single crystal ingot having a target resistivity in a silicon melt by the Czochralski method, including steps of: deriving a resistivity value according to a dopant concentration included in a raw material and tabulating the resistivity value with reliable data; setting a reference value of a dopant concentration with respect to a target resistivity value; deriving a measurement value with respect to the dopant concentration included in the raw material itself; calculating a difference value between the reference value and the measurement value; and performing a counter doping on the silicon melt as much as the difference value. Accordingly, a single crystal ingot having a resistivity of 8 kΩ or more can be grown without improving impurities included in the raw material itself.

10 Claims, 4 Drawing Sheets

(51) Int. Cl.
*C30B 29/06* (2006.01)
*C30B 15/04* (2006.01)

(56) References Cited

FOREIGN PATENT DOCUMENTS

| | | |
|---|---|---|
| JP | 2002226295 A | 8/2002 |
| JP | 2003-137687 A | 5/2003 |
| JP | 2009-215135 A | 9/2009 |
| JP | 2010-29894 A | 2/2010 |
| JP | 2014156376 A | 8/2014 |
| KR | 10-0749936 B1 | 8/2007 |
| KR | 10-2012-0004235 A | 1/2012 |
| KR | 10-2013-0041733 A | 4/2013 |

OTHER PUBLICATIONS

Notice of Allowance for corresponding KR 10-2015-0114062, dated Oct. 28, 2016, 2pp.
Han, D.J. et al.; "High-gain bipolar detector on float-zone silicon"; Nuclear Instruments & Methods in Physics Research; Section A; 512; 2003; pp. 572-577.
Japanese Office Action dated Jan. 8, 2019 for corresponding JP Application No. 2018-506843 (2 pages).

\* cited by examiner

METHOD FOR GROWING SINGLE CRYSTAL

CROSS-REFERENCE TO RELATED APPLICATION(S)

This application is a National Phase Patent Application and claims priority to and the benefit of International Application Number PCT/KR2016/006782, filed on Jun. 24, 2016, which claims priority to Korean Patent Application Number 10-2015-0114062, filed on Aug. 12, 2015, the entire contents of all of which are incorporated herein by reference.

TECHNICAL FIELD

The present invention relates to a method for growing a single crystal, and more particularly, to a method capable of growing a single crystal having a target resistivity without controlling impurities included in raw material.

BACKGROUND ART

In general, in a method for growing a silicon single crystal according to the Czochralski method, a raw material (polycrystalline silicon) is loaded inside a quartz crucible, polycrystalline silicon is melted by heat radiated from a heater to form a silicon melt, and then a silicon single crystal is grown from a surface of the silicon melt.

A silicon wafer used as a substrate for a semiconductor device is added with a P-type dopant or an N-type dopant in the silicon single crystal growth process so as to have an appropriate resistivity value. In addition, the P-type dopant or the N-type dopant is further classified into a high-melting-point dopant whose melting point is higher than that of silicon and a low-melting-point dopant whose melting point is lower than that of silicon, and a method of adding a dopant to a silicon melt varies depending on a type of a dopant.

A maximum resistivity value of an ingot, which may be realized with impurities included in a raw material (polysilicon, quartz crucible) currently used, is about 5 kΩ on the basis of the P-type. It is necessary to control a level of donor and acceptor included in a raw material in order to secure a resistivity of 8 kΩ or more.

In the related art, since impurities included in a raw material may not be accurately checked, a single crystal ingot was grown without introducing a dopant, and a part of a grown initial body was processed into a sample to measure a resistivity. In the case of this, since a procedure for calculating and inputting a necessary amount of dopant so as to have a target resistivity value is required and a growing time of a single crystal body for manufacturing a sample, an evaluation time of a sample, and doping time are added, there are problems that a process loss time is generated and the productivity of single crystal growth is also deteriorated.

DISCLOSURE

Technical Problem

The present invention is directed to solving the above-described problems and providing a method for growing a single crystal ingot capable of simplifying a process for growing a single crystal ingot having a target resistivity.

The present invention is directed to providing a method for growing a single crystal ingot having a resistivity of 8 kΩcm or more without controlling impurities included in a raw material itself.

Technical Solution

According to an embodiment, there is provided a method for growing a single crystal ingot having a target resistivity in a silicon melt by the Czochralski method, including steps of: deriving a resistivity value according to a dopant concentration included in a raw material and tabulating the resistivity value with reliable data; setting a reference value of a dopant concentration with respect to a target resistivity value; deriving a measurement value with respect to the dopant concentration included in the raw material itself; calculating a difference value between the reference value and the measurement value; and performing a counter doping on the silicon melt as much as the difference value.

In addition, the target resistivity is in a range of 8 to 14 kΩcm, and the dopant concentration is a value obtained by subtracting an N-type dopant concentration from a P-type dopant concentration.

Advantageous Effects

According to a method for growing a single crystal ingot according to an embodiment, when a silicon single crystal having a target resistivity grows, since a table configured to illustrate a relationship of a resistivity according to an impurity concentration included in a raw material is obtained in advance, and an impurity concentration which has a target resistivity value is set, a single crystal ingot having a target resistivity can be grown by measuring only an impurity concentration included in the raw material itself.

According to a method for growing a single crystal ingot according to an embodiment, it is possible to omit a process of processing a part of body of a grown single crystal ingot to a sample and a process of performing doping as in the related art, thereby improving productivity of a single crystal ingot having a target resistivity.

MODES OF THE INVENTION

Hereinafter, embodiments of the present invention will be described in detail with reference to the accompanying drawings, but is not limited thereto. In describing the present invention, a detailed description of well-known functions or constructions may be omitted to clarify the gist of the present invention.

An embodiment proposes a method for growing a silicon single crystal having a target resistivity, and in particular, a method for growing a single crystal having a resistivity of 8 kΩcm or more and 15 kΩcm or less.

In an embodiment, a table configured to illustrate a relationship of a resistivity according to an impurity concentration included in a raw material is verified and secured through experiments. That is, since an impurity concentration which has a target resistivity value is set, a single crystal ingot having the target resistivity may be grown by measuring only an impurity concentration included in the raw material itself and then performing further doping. The raw material may be polysilicon which is a material of a quartz crucible or a single crystal.

Figure 1:
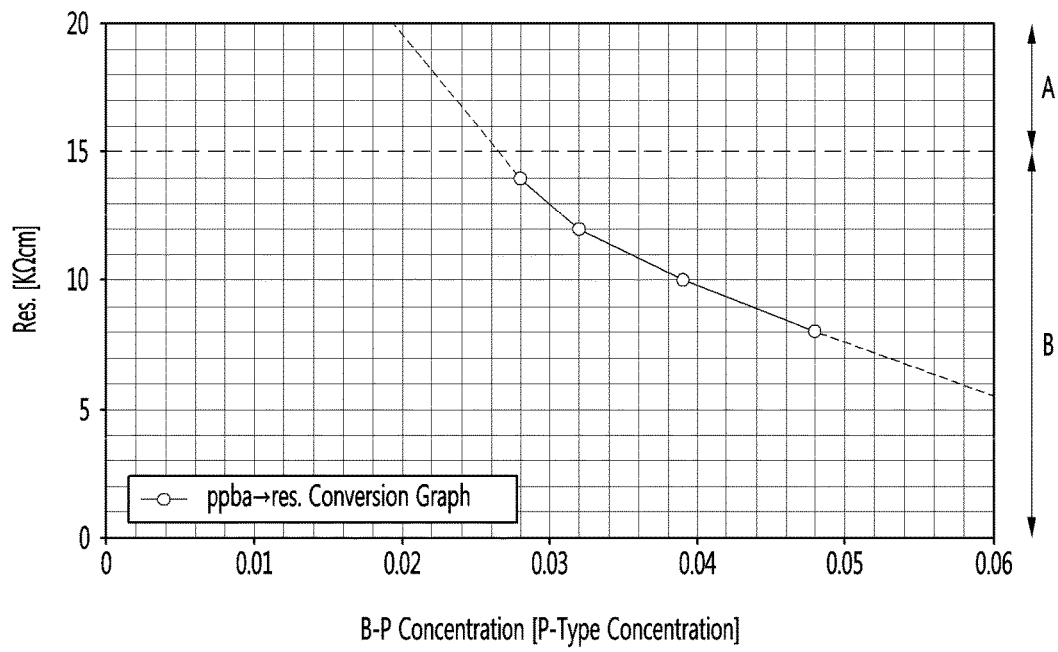
FIG. 1 is a graph illustrating a resistivity value according to an impurity level of a raw material.

FIG. 1 is a graph illustrating a resistivity value according to an impurity level of a raw material.

Referring to FIG. 1, a horizontal axis represents a concentration of a P-type impurity and a vertical axis represents a resistivity (kΩcm) of the grown single crystal ingot. The concentration of the P-type impurity is a value (B–P) obtained by subtracting a concentration of phosphorus (N-type) from a concentration of boron (P-type) included in the polysilicon on the basis of the P-type.

Section A represents a theoretical value according to a result value, and section B represents a section where data is reliable by test verification. When the P-type concentration was maintained as in the section B where a resistivity of the single crystal ingot was smaller than 15 kΩcm, a target resistivity value could be obtained. In an embodiment, the data in the section B in FIG. 1 is tabulated and set as a reference value for the concentration of the P-type impurity for obtaining the target resistivity. Hereinafter, impurities may be understood to refer to the same as dopants.

However, in the section A where the resistivity of the single crystal ingot is larger than 15 KΩ, the concentration that is controlled is very small, and the reliability of the data obtained by reacting sensitively to the change of the impurity of the raw material is low, and it is difficult to obtain a target resistivity. Accordingly, the present embodiment proposes the method for growing the resistivity of the single crystal ingot to 15 kΩcm or less.

Figure 2:
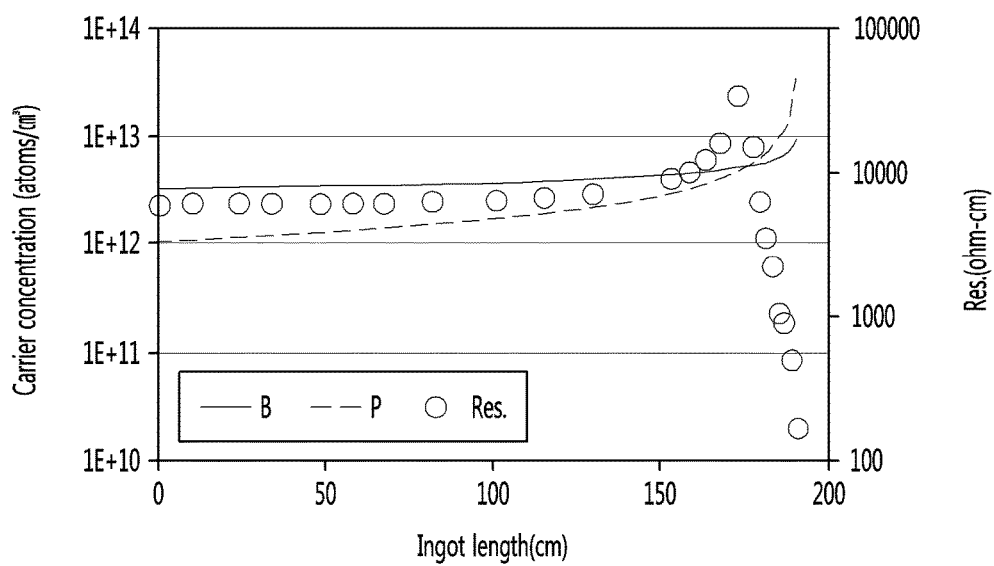
FIG. 2 is a graph illustrating a change of a resistivity depending on influence of a dopant in silicon melt.

FIG. 2 is a graph illustrating a change in concentration depending on a length of a single crystal ingot.

Referring to FIG. 2, it can be confirmed that inversion of a resistivity occurs due to an N-type (phosphorus) component included in a raw material as a single crystal ingot grows and an amount of a dopant (boron) decreases. This is because the concentration of phosphorus increases as the amount of melt decreases due to difference in a segregation coefficient between the boron and the phosphorus.

Therefore, it can be recognized that the amount of the dopant included in the silicon melt can be small in order to increase the resistivity of the single crystal ingot. In an embodiment, the P-type dopant is boron and the N-type dopant is phosphorus.

Figure 3:
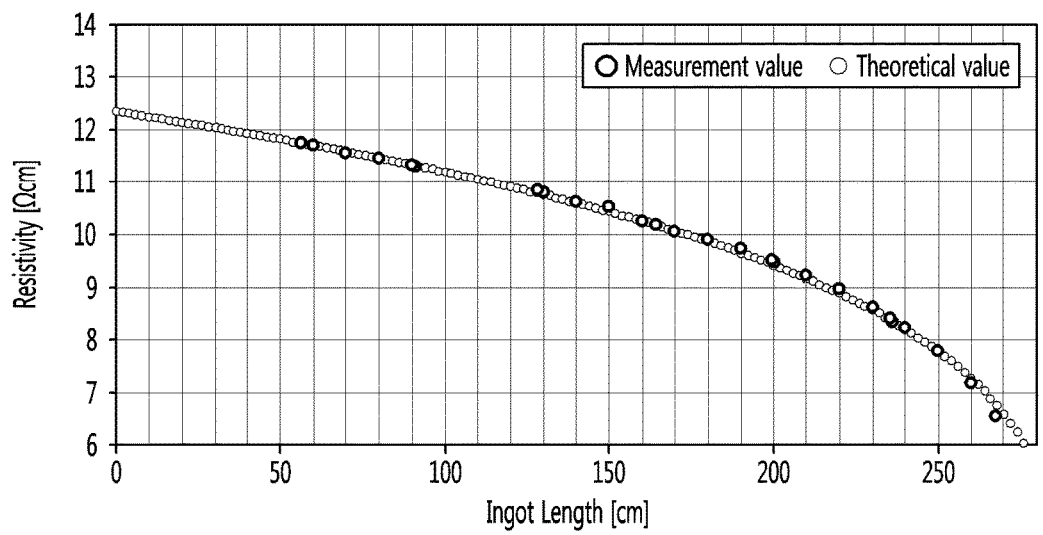
FIG. 3 is a view illustrating a profile of a normal P-type resistivity band.

FIG. 3 is a view illustrating a profile of a normal P-type resistivity band according to a length of an ingot. Referring to FIG. 3, in the section where the resistivity of the single crystal ingot is in a range of 6 to 12 kΩ, it can be recognized that an influence by the impurity of the raw material itself is little according to a length of the ingot, and the theoretical value and the measurement value is almost identical according to the segregation coefficient (boron 0.7 and phosphorus 0.35).

It can be interpreted that the P-type dopant included in the silicon melt is absolutely larger than the N-type dopant so that the resistivity has no significant change, and it can be recognized that it is easy to calculate the amount of dopant for obtaining the target resistivity.

The method for growing a single crystal ingot having a target resistivity according to an embodiment is as follows.

First, a level of impurities in a raw material (polysilicon, quartz crucible) used for growing a single crystal is confirmed. Table 1 illustrates a measured concentration of the raw material itself and a resistivity associated therewith, and the value is measured at 0 mm of a grown single crystal ingot body.

TABLE 1

| Measured Concentration (ppba) | Convert Concentration to Resistivity (Ωcm) |
|---|---|
| 0.078 | 4950 |

Table 1 is a result of measuring a concentration of impurities by a low temperature FT-IR after growing a single crystal ingot by introducing only polysilicon as a raw material without introducing a separate dopant. A measured concentration is on the basis of the P-type and is a value obtained by subtracting a concentration of the phosphorus (N-type) from a concentration of the boron (P-type) included in the polysilicon.

A reason why the concentration of the phosphorus (N-type) is subtracted from the concentration of the boron (P-type) as described above is that a segregation phenomenon occurs both in the P-type and the N-type when the single crystal ingot grows, but a type in which an absolute amount of dopant is dominant takes up a large portion in its role as a semiconductor. That is because remaining dopants affect an activation of the semiconductor after the P-type of Group III and the N-type of Group V form a pair.

Table 2 is an estimated concentration that may satisfy the resistivity of 8 kΩ cm or more in entire sections of the single crystal ingot on the basis of 0 mm of the grown single crystal ingot body. This is the data obtained in the section B of FIG. 1 and is the reference value for the concentration of the P-type impurity for obtaining the target resistivity.

TABLE 2

| Measured Concentration (ppba) | Convert Concentration to Resistivity (Ωcm) |
|---|---|
| 0.048 | 8000 |

In order for the grown single crystal ingot to have the resistivity of 8 kΩcm or more as shown in Table 2, it can be recognized that a value which is obtained by subtracting the concentration of the phosphorus (N-type) from the measured concentration of the boron (P-type), can be 0.048 ppba. That is, it can be recognized that when the N-type (phosphorus) dopant is additionally introduced and doped as much as the difference of 0.03 ppba, a single crystal ingot having the resistivity of 8 kΩcm or more may be grown.

That is, in an embodiment, the concentration of the impurity included in the raw material is measured, and an estimated value with respect to the concentration when the resistivity is 8 kΩcm is calculated. In addition, it is possible to have the resistivity value of 8 kΩcm or more at entire sections of the ingot grown by performing phosphorus counter doping as much as the difference value. That is, in an embodiment, it is possible to grow a single crystal having a target resistivity without controlling the concentration of an impurity included in a raw material.

Figure 4:
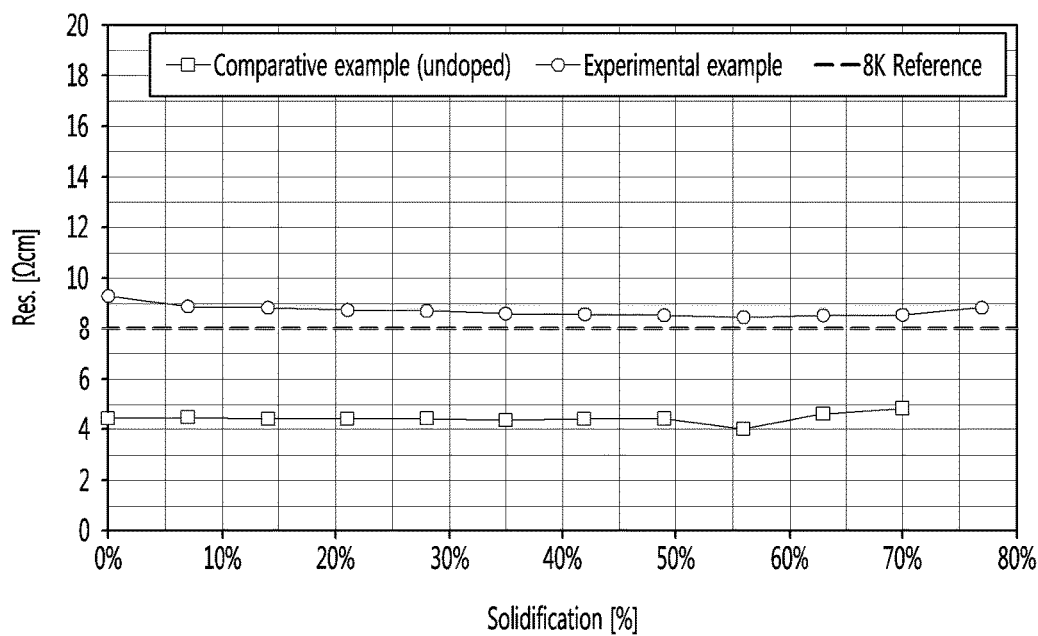
FIG. 4 is a graph illustrating a resistivity of a single crystal ingot after an N-type dopant (phosphorus) is introduced as much as the difference of 0.03 ppba on the basis of an end portion of a single crystal ingot body.

FIG. 4 is a graph illustrating a resistivity of a single crystal ingot after an N-type dopant (phosphorus) is introduced as much as the difference of 0.03 ppba on the basis of an end portion of a single crystal ingot body.

Referring to FIG. 4, in a comparative example in which doping was not performed, the resistivity had a value of 4 to 5 kΩcm while the single crystal ingot was solidified. However, when doping was performed according to the impurity level of the raw material as much as an estimated value, the resistivity was larger than 8 kΩcm in entire sections where the silicon ingot is solidified.

Figure 5:
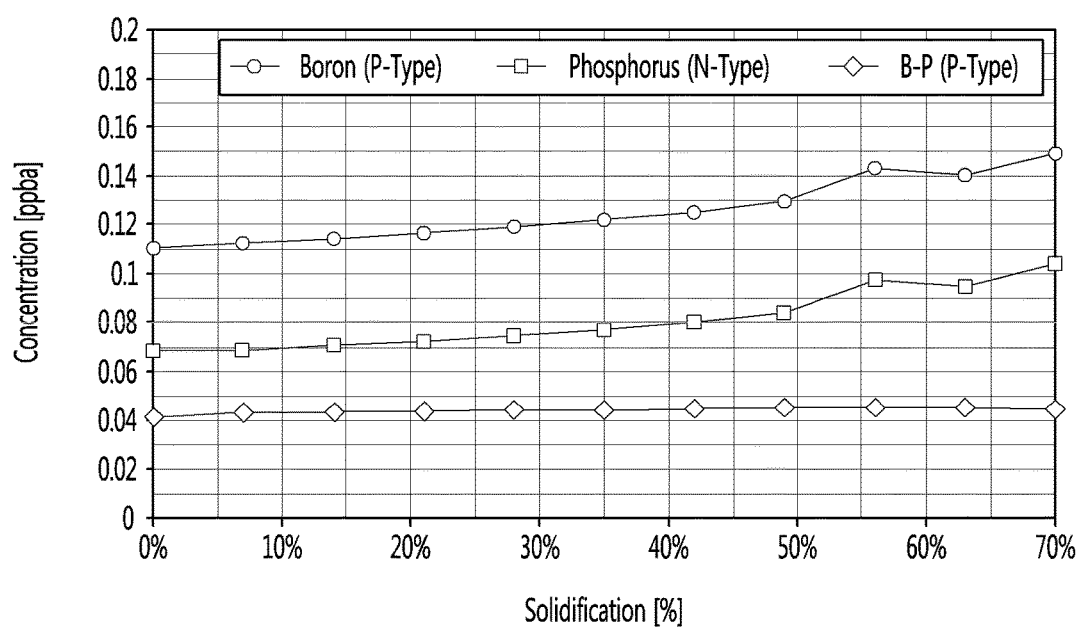
FIG. 5 is a graph illustrating a concentration and concentration difference of P-type and N-type dopants included in a silicon melt as a single crystal ingot gradually grows.

FIG. 5 is a graph illustrating a concentration and concentration difference of P-type and N-type dopants included in a silicon melt as a single crystal ingot gradually grows.

Referring to FIG. 5, while the solidification of the single crystal ingot proceeds, the concentrations of the P-type and N-type dopants tends to gradually increase, but it can be confirmed that a difference value is almost constant. Therefore, when the counter doping corresponding to the estimated value is performed, it is possible to obtain a resistivity larger than 8 kΩcm throughout the entire sections of the single crystal ingot.

Figure 6:
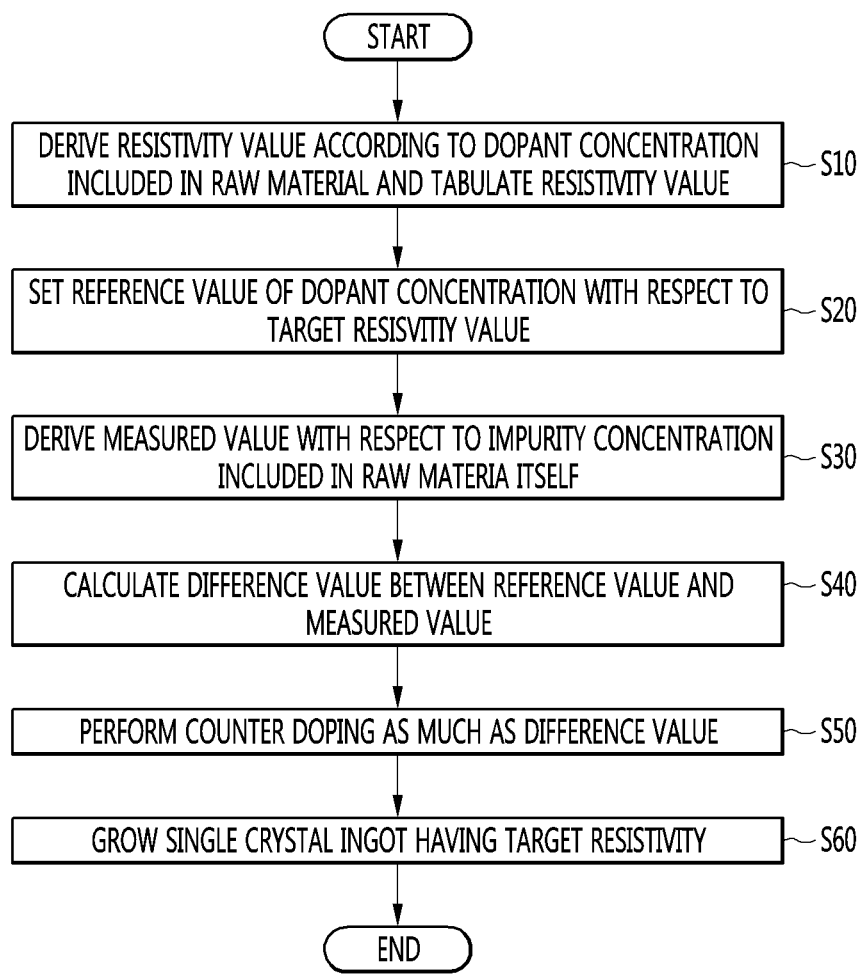
FIG. 6 is a flowchart of a method for growing a single crystal ingot according to an embodiment of the present invention.

FIG. 6 is a flowchart illustrating a method for growing a single crystal ingot according to an embodiment of the present invention. The embodiment is a method for growing a single crystal ingot of P-type, and first, a resistivity value is derived according to a dopant concentration included in the raw material in use currently and is tabulated with reliable data (S10). At this point, the embodiment was executed with respect to a section with a highly reliable resistivity of 8 to 14 kΩcm through a test verification.

In the embodiment, in order to grow a single crystal ingot having a resistivity of 8 kΩcm or more, the P-type concentration (boron concentration-phosphorus concentration) corresponding to 8 kΩcm is set as a reference value (S20).

In addition, only the present raw material (polysilicon) is introduced without introducing a dopant to grow a single crystal ingot, and then a measurement value of a resistivity and the P-type impurity concentration are obtained at 0 cm of the single crystal ingot body (S30).

Next, a difference value between the reference value and the measurement value is calculated (S40), and counter doping is performed such that an N-type dopant is introduced as much as the difference value (S50). A single crystal ingot having a resistivity of 8 kΩcm or more may be grown by performing the above-described counter doping (S60).

However, the resistivity value at 0 cm of the actual single crystal ingot body needs a doping amount larger than the difference value due to the segregation coefficient of the dopant.

TABLE 3

| Category | Experimental Example |
| --- | --- |
| Number of Phosphorus Atoms in Melt (atoms/cm³) | 6.88114E+12 |
| Body 0 mm Melt -> Number of Ingot Atoms (atoms/cm³) | 2.02000E+12 |
| Dopant Amount in Melt at Body 0 mm (mg) | 24 |
| Amount of Dopant introduced in Ingot (mg) | 10 |

As shown in Table 3, it can be recognized that a donor (N-type impurity) necessary at 0 cm of the single crystal ingot body is a level of 0.296 (29.6%) with respect to the actual amount of introduction.

Therefore, the counter doping amount required for growing a single crystal ingot having a resistivity of 8 kΩ cm or more on the basis of the above-described experimental results may be calculated by the following Equation 1.

$$C = (A - B) \times \frac{1}{k}$$ [Equation 1]

{A: impurity measurement value of a raw material (P-type impurity concentration–N-type impurity concentration), B: P-type impurity concentration for obtaining target resistivity–reference value of N-type impurity, C: counter doping amount, concentration of N-type impurity, and K: correction value according to segregation of N-type impurity (0.296)}

A method for growing an N-type single crystal ingot is described as another embodiment.

An introduction amount of the N-type dopant necessary for securing a target resistivity is calculated and set the introduction amount as a reference value. For example, the concentration of the N-type dopant necessary for securing a resistivity of 8 kΩcm or more is derived, which may be obtained through a table of the concentration relationship of the dopant with respect to the target resistivity which has been tested as shown in FIG. 1.

In addition, the concentration of the N-type dopant is calculated according to the impurity level of a raw material and set the concentration as a measurement value, and the difference between the reference value and the measurement value is derived to determine an amount of the N-type dopant.

For example, in order to secure a resistivity of 8 kΩ cm or more, the concentration of the raw material impurity is compared with the reference value, and when a difference value is derived, the N-type dopant as much as the difference value is introduced.

However, since P-type is dominant in the impurity level of the raw material, counter doping is not necessary for growing an N-type single crystal ingot. An N-type silicon single crystal ingot having the target resistivity may be manufactured through the above-described process.

According to a method for growing a single crystal ingot according to an embodiment, since a table illustrating a relationship of a resistivity according to an impurity concentration included in a raw material is obtained in advance when a silicon single crystal having a target resistivity grows and an impurity concentration which has a target resistivity value is set, a single crystal ingot having a target resistivity can be grown by measuring only an impurity concentration included in the raw material itself.

Although embodiments have been mostly described above, they are only examples and do not limit the present invention and a person skilled in the art may appreciate that several variations and applications not presented above may be made without departing from the essential characteristics of the embodiments. For example, each of components described in detail in the embodiment may be implemented in a modifiable manner. Also, it can be construed that differences related to such variations and applications are included in the scope of the present invention defined in the appended claims.

INDUSTRIAL APPLICABILITY

According to the present invention, since a single crystal having a target resistivity can be grown without controlling an impurity level in a raw material when growing the single crystal and a single crystal having a resistivity of 8 kΩcm or more can be grown, there is industrial applicability.

The invention claimed is:

1. A method for growing a single crystal ingot having a target resistivity in a silicon melt by the Czochralski method, comprising:
   deriving a resistivity value according to a dopant concentration included in a raw material to tabulate the derived resistivity value with reliable data;
   setting a reference value of a dopant concentration with respect to a target resistivity value;
   deriving a measurement value with respect to the dopant concentration included in the raw material itself;
   calculating a difference value between the reference value and the measurement value; and
   performing a counter doping on the silicon melt as much as the difference value.

2. The method of claim 1, wherein the target resistivity is in a range of 8 to 14 kΩcm.

3. The method of claim 1, wherein the single crystal ingot is a P-type.

4. The method of claim 1, wherein the dopant concentration is a value obtained by subtracting an N-type dopant concentration from a P-type dopant concentration.

5. The method claim 4, wherein the P-type dopant is boron and the N-type dopant is phosphorus.

6. The method claim 1, wherein the deriving of the measurement value with respect to the dopant concentration included in the raw material itself comprises measuring a dopant concentration by introducing only a polysilicon into the silicon melt without introducing a dopant to grow an ingot.

7. The method claim 1, wherein the raw material comprises a polysilicon and a quartz crucible.

8. The method claim 1, wherein the performing of the counter doping on the silicon melt as much as the difference value comprises introducing an N-type dopant into the silicon melt as much as the difference value.

9. The method claim 1, wherein the reference value is a theoretical value capable of obtaining a resistivity in a range of 8 to 14 KΩ cm in entire body sections of the single crystal ingot.

10. The method claim 1, wherein an N-type dopant necessary at 0 cm of the single crystal ingot body is 29.6% with respect to an actual counter doping amount due to a segregation coefficient of a dopant, and the counter doping amount is calculated by the following Equation 1, $$C = (A - B) \times \frac{1}{k} \quad \text{[Equation 1]}$$

{A: impurity measurement value of a raw material (P-type impurity concentration−N-type impurity concentration), B: P-type impurity concentration for obtaining target resistivity−reference value of N-type impurity, C: counter doping amount and concentration of N-type impurity, and K: correction value according to segregation of N-type impurity (0.296)}.

* * * * *